United States Patent [19]
Brady et al.

[11] Patent Number: 5,436,927
[45] Date of Patent: Jul. 25, 1995

[54] METHOD AND APPARATUS FOR TESTING FREQUENCY SYMMETRY OF DIGITAL SIGNALS

[75] Inventors: Gary Brady, Aloha, Oreg.; David Ellis, Hillsboro, Oreg.

[73] Assignee: Intel Corporation, Santa Clara, Calif.

[21] Appl. No.: 40,477

[22] Filed: Mar. 31, 1993

[51] Int. Cl.$^6$ .................. H04B 3/46; H04B 17/00
[52] U.S. Cl. .................. 375/224; 375/362; 455/192.2; 327/41; 327/40
[58] Field of Search .................. 375/10, 97, 111, 224, 375/225, 226, 227, 228, 344, 362; 455/192.1, 192.2; 328/133, 134, 140, 141; 307/525, 526, 527; 327/40, 41, 42

[56] References Cited

U.S. PATENT DOCUMENTS

| | | | |
|---|---|---|---|
| 3,688,201 | 8/1972 | Pommerening | 328/133 |
| 3,987,365 | 10/1976 | Okada et al. | 328/133 |
| 4,278,898 | 7/1981 | Rhode | 328/133 |
| 4,484,291 | 11/1984 | Schlösser | 328/133 |
| 5,180,935 | 1/1993 | Abdi et al. | 328/141 |

*Primary Examiner*—Stephen Chin
*Assistant Examiner*—William Luther

*Attorney, Agent, or Firm*—Blakely, Sokoloff, Taylor & Zafman

[57] ABSTRACT

A first and a second input generating circuits, a first and a second set of counters, and a first and a second comparison circuits are provided to test whether the frequencies of a first and a second periodic digital signal are symmetric. The first and second input generating circuits generate enable inputs for the first and second sets of counters using the first and second digital signals respectively. The first and second sets of counters count the first and second digital signals while the enable inputs are provided. The first comparison circuit monitors the first set of counters, and stops both input generating circuits from providing further enable inputs to both sets of counters, after the first set of counters reaches a predetermined level, thereby stopping both sets of counters from further counting. The second comparison circuit monitors the second set of counters, and issues a control signal indicating the first and second digital signals are symmetric to each other in frequency, if the second set of counters also stops substantially at the predetermined level, i.e. within an acceptable threshold.

17 Claims, 6 Drawing Sheets

METHOD AND APPARATUS FOR TESTING FREQUENCY SYMMETRY OF DIGITAL SIGNALS

BACKGROUND OF THE INVENTION

1. Field Of the Invention

The present invention relates to the field of high speed digital circuits, in particular, high speed digital circuits based on CMOS technology. More specifically, the present invention relates to a method and apparatus for testing frequency symmetry of digital signals propagating in high speed digital circuits of a digital system, such as a data instrumentation system.

2. Background

In a number of digital applications, such as data instrumentation, it is often necessary to determine whether two digital signals are symmetric to each other in frequency. A particular example is when digital clock skew is digitally compensated for a high speed digital circuit by reconstructing the digital clock, as the digital clock passes from one high speed digital circuit to another. More specifically, when the reconstructed digital clock is generated by a flip flop using the entering digital clock, a constant high enable and a clear signal.

Under this approach, the reconstructed digital clock is generated by clocking the constant high enable into the flip flop at the rising clock edge of a clock period. Concurrently, the constant high enable and its complement are clocked out of the flip flop. The complement output, after having been properly delayed, is used to assert an active low at the clear input of the flip flop clearing its content as well as it outputs, which in turn causes the active low to be deasserted. As the process continues, the reconstructed digital clock is generated. However, if the active low is not deasserted before the rising clock edge of the next clock period, the reconstructed digital clock will have at most half of the frequency of the entering digital clock.

Thus, it is desirable to be able to test and determine whether the entering and the reconstructed digital clocks are symmetric to each other in frequency. As will be disclosed, the present invention provides such a method and apparatus, which advantageously achieves the desirable results. As will be obvious from the descriptions to follow, the present invention has particular application to high speed data instrumentation systems.

SUMMARY OF THE INVENTION

Under the present invention, the desirable results are advantageously achieved by providing a first and a second input generating circuits, a first and a second set of counters, and a first and a second comparison circuits. The first and second input generating circuits generate enable inputs for the first and second sets of counters using the first and second periodic digital signals being compared respectively. The first and second sets of counters count the first and second digital signal while the enable inputs are provided. The first comparison circuit monitors the first set of counters, and stops both input generating circuits from providing further enable inputs to both sets of counters, after the first set of counters reaches a predetermined level, thereby stopping both sets of counters from further counting. The second comparison circuit monitors the second set of counters, and issues a control signal indicating the two digital signals are symmetric to each other in frequency, if the second set of counters also stops substantially at the predetermined level, i.e. within an acceptable threshold.

BRIEF DESCRIPTION OF THE DRAWINGS

The objects, features, and advantages of the present invention will be apparent from the following detailed description of the presently preferred and alternate embodiments of the invention with references to the drawings in which.

DETAILED DESCRIPTION PRESENTLY PREFERRED AND ALTERNATE EMBODIMENTS

In the following description for purposes of explanation, specific numbers, materials and configurations are set forth in order to provide a thorough understanding of the present invention. However, it will be apparent to one skilled in the art that the present invention may be practiced without the specific details. In other instances, well known systems are shown in diagrammatical or block diagram form in order not to obscure the present invention unnecessarily.

Figure 1:
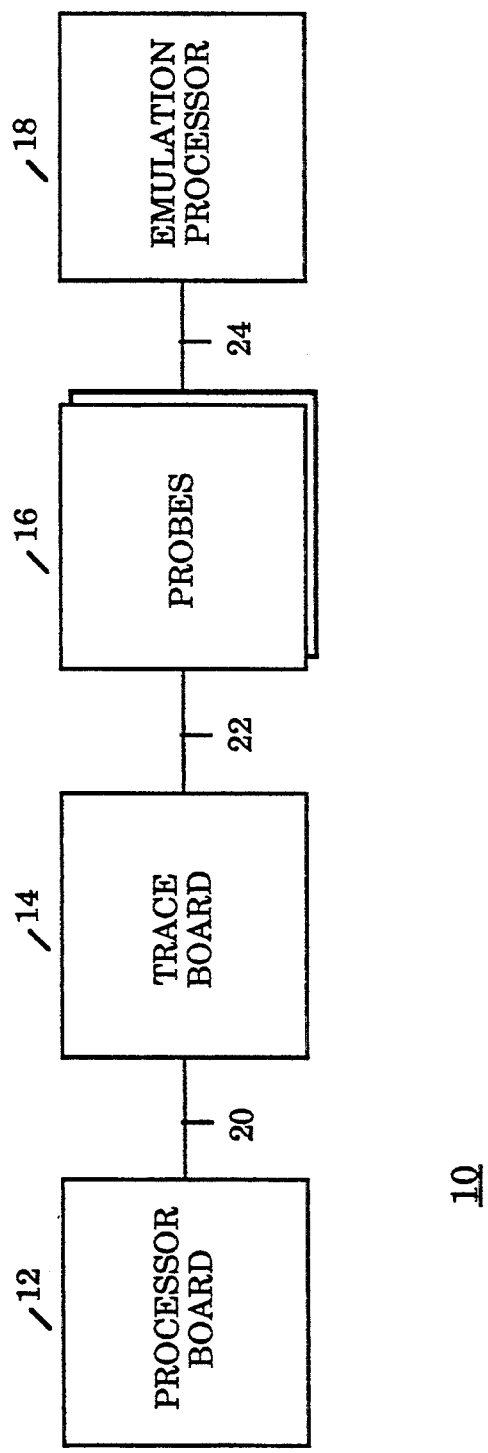
FIG. 1 illustrates an exemplary high speed data instrumentation system incorporated with the teachings of the present invention.

Referring now to FIG. 1, a block diagram illustrating an exemplary data instrumentation system incorporated with the teachings of the present invention is shown. Shown is an exemplary data instrumentation system 10 incorporated with the teachings of the present invention coupled to a target system 11 for monitoring, acquiring data, and controlling the target system 11. Depending on the target system 11, the data instrumentation system 10 may be operated with different operating speeds at different times. The exemplary data instrumentation system 10 comprises a processor board 12, a trace board 14 incorporated with the teachings of the present invention, and a number of probes 16, while the target system 11 comprises an emulation processor. The processor board 12 is coupled to the trace board 14, for example, through a parallel bus 20. The trace board 14 is coupled to the probes 16, for example, through a number of parallel cables 22. The probes 16 are in turn coupled to the emulation processor 18. The trace board 14 will be described below in further detail with additional references to the remaining figures. The processor board 12, the probes 16 and the emulation processor 18 are intended to represent a broad category of these elements found in many data instrumentation and target systems. Their constitutions and functions are well known and will not be further described.

Figure 2:
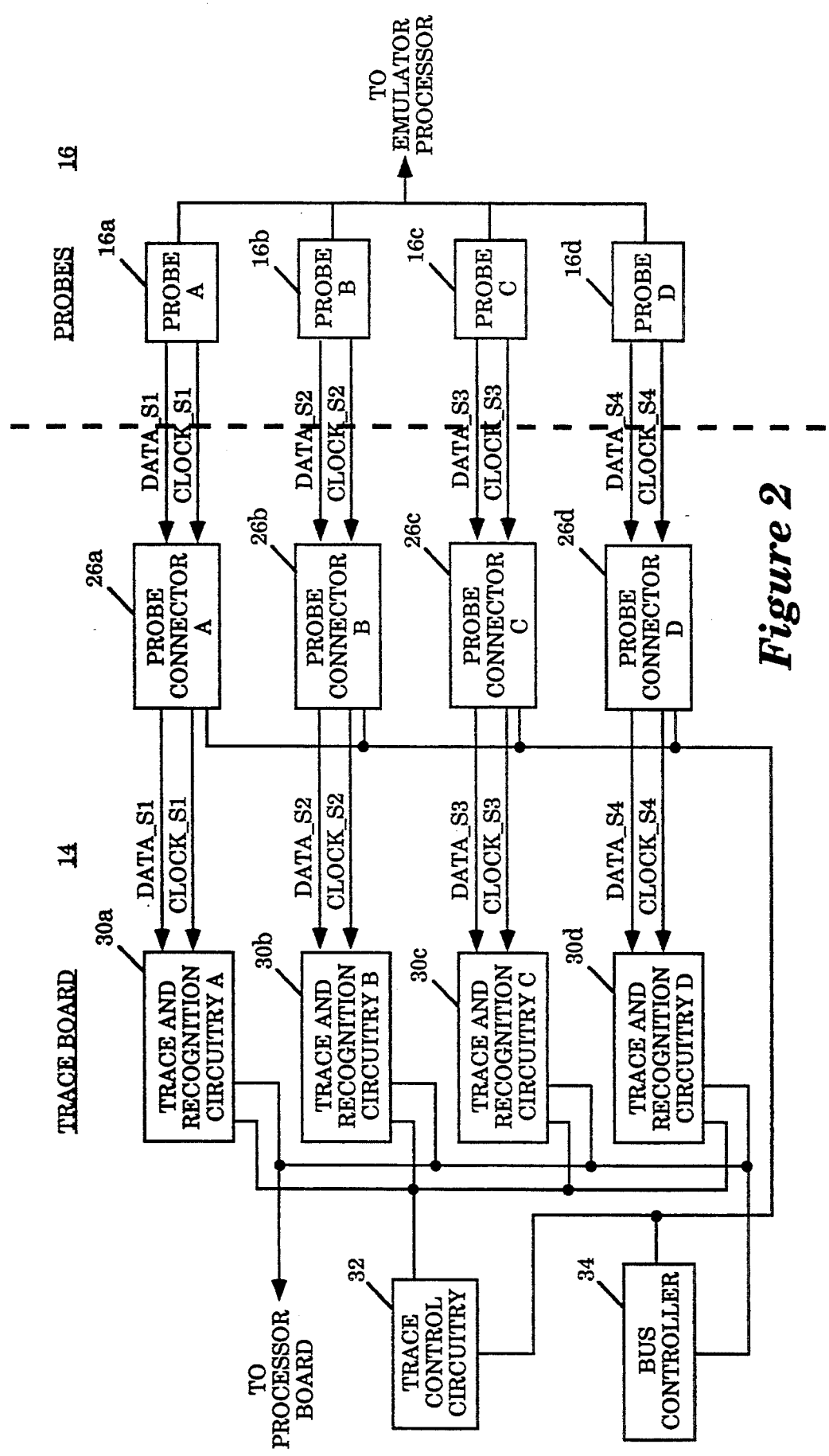
FIG. 2 illustrates the trace board of FIG. 1 in further detail.

Referring now to FIG. 2, a block diagram illustrating the trace board of FIG. 1 in further detail is shown. The trace board 14 comprises a plurality of high speed trace and recognition circuitry (TAR) 30a–30d incorporated with the teachings of the present invention, a number of probe connectors 26a–26d, a bus controller 34, and trace control circuitry 32. The probe connectors 26a–26d, the bus controller 34, and the trace control circuitry 32 are all coupled to the high speed TARs 30a–30d. The probe connectors 26a–26d are also coupled to the bus controller 34 and the trace control circuitry 32. Each of the high speed TARs 30a–30d receives probe data along with its own digital clock from a probe 16a–6d through its corresponding probe connector 26a–26d. The digital clocks are skewed as they travel from the probes 16a–6d to the TARs 30a–30d. While each of the high speed TARs 30a–30d may operate at different operating speed for different target systems, its components do require a minimum amount of high and low time in each of the clock period of the digital clock it receives along with the probe data. Thus, each high speed TAR 30a–30d is provided with digital clock reconstruction and related circuitry for compensating the entering clock's skew, and ensuring the required amount of high and low time is provided. In particular, each high speed TAR 30a–30d is provided with the frequencies symmetry testing circuit of the present invention, which will be described in further detail below with references to FIGS. 4, and 5a–5b. The digital clock reconstruction and other related circuitry provided to each of the high speed TARs 30a–30d will be briefly described below with references to FIG. 3. Otherwise, the high speed TARs 30a–30d, the probe connectors 26a–26d, the bus controller 34, and the trace control circuitry 32 are intended to represent a broad category of these elements found in many trace boards, including but not limited the trace boards described in copending U.S. Patent Applications, Ser. No. 08/040,902, filed Mar. 31, 1993, entitled Method and Apparatus For Deskewing/Resynchronizing Data Slices With Variable Skews, and Ser. No. 08/040,901, filed Mar. 31, 1993, entitled Method And Apparatus For Synchronizing Periodic Sync Pulse Generations By A Number Of High Speed Circuits, both assigned to assignee of the present invention, which are hereby fully incorporated by reference. Their constitutions and functions will not be further described.

While the present invention is being described with high speed TARs of a trace board of a data instrumentation system, based on the description to follow, it will be appreciated that the present invention may be practiced with other high speed digital circuits on the data instrumentation system. In fact, the present invention may be practiced with other digital systems comprising high speed circuit, such as a high speed microprocessor based computer system.

Figure 3:
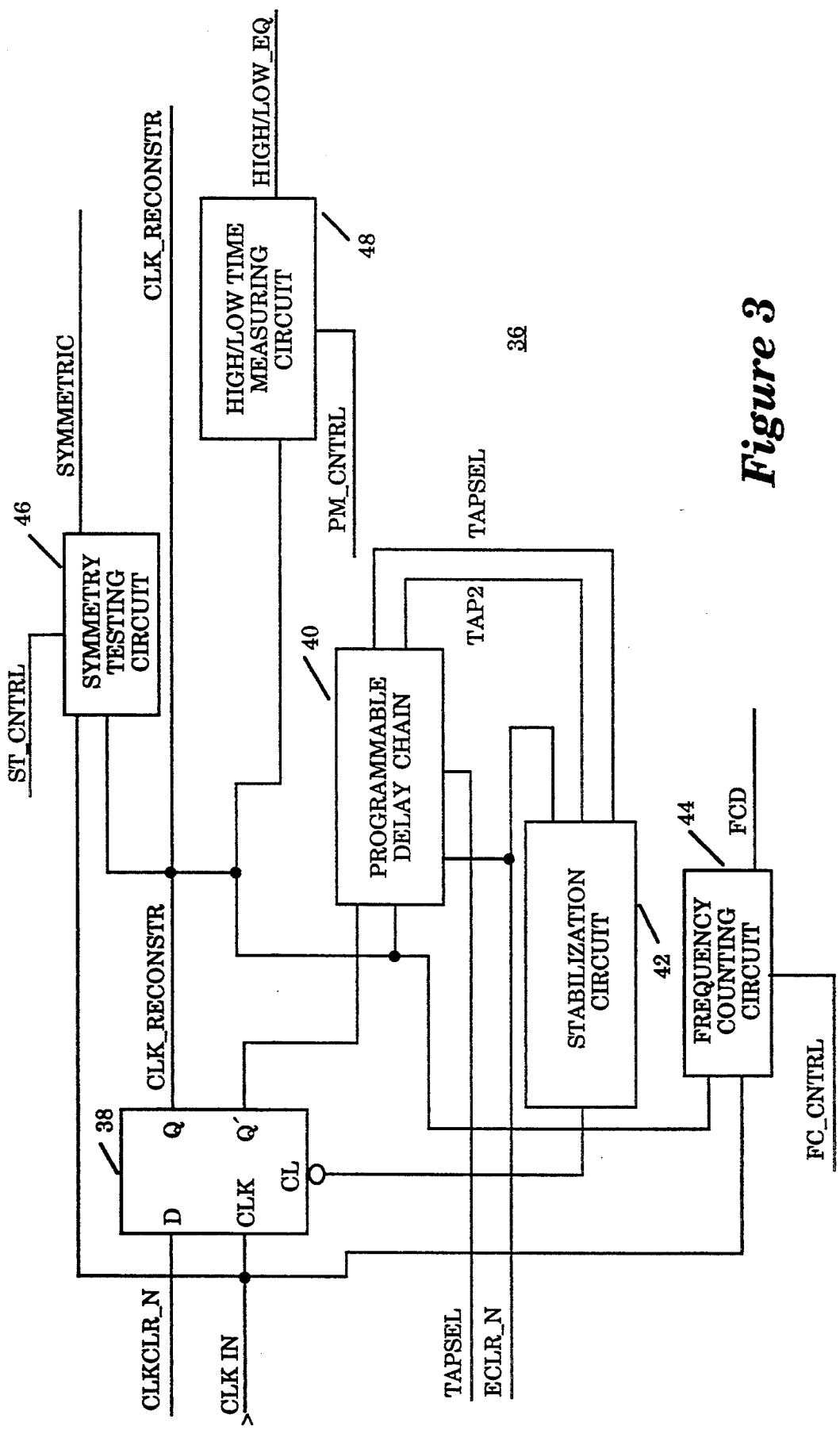
FIG. 3 illustrates the digital clock reconstruction and related circuits of the TARs of FIG. 2.

Referring now to FIG. 3, a block diagram illustrating the digital clock reconstruction and related circuitry provided to each of the TARs of FIG. 2 is shown. As illustrated, each TAR is provided with a digital clock reconstruction circuit 36 and at a minimum, a measurement or a comparison circuit 44. Preferably, for improved reliability, multiple measurement or comparison circuits 44 are provided, and for improved useability, a ring oscillator 64 is also provided. As described earlier, the measurement or comparison circuits 44 comprise the frequency symmetry testing circuit of the present invention. The digital clock reconstruction circuit 36 is used to generate a first reconstructed clock (CLK_RECNSTR), and preferably a second reconstructed clock (CLK_RECNSTR') based on the entering clock (CLK_IN). When calibrated, CLK_RECNSTR corrects the digital skew of CLK_IN and meets the minimum high and low time requirement of the TAR regardless of the ultimate operating speed. CLK_RECNSTR' is used as a basis during normal operation for providing early warning to the fact that the period of CLK_RECNSTR is starting to drift away 50% duty cycle symmetry. The measurement or comparison circuits 44 are used to selectively measure the frequencies of CLK_RECNSTR and CLK_RECNSTR' or compare them to the frequency of CLK_IN during calibration and normal operation of the digital clock reconstruction circuit 36. The frequency symmetry testing circuit of the present invention is used during both calibration and normal operation of the digital clock reconstruction circuit 36. The ring oscillator 64 is used to generate a number of ring signals during calibration. For further descriptions of the digital clock reconstruction circuit 36, other measurement and comparison circuits 44, the ring oscillator 64, the difference between CLK_RECNSTR and CLK_RECNSTR', the calibration process, and monitoring during normal operation, see copending U.S. Patent Applications, Ser. No. 08/040,424, entitled Method and Apparatus For Digitally Compensating Digital Clock Skew For High Speed Digital Circuits, and Ser. No. 08/040,623, entitled Method and Apparatus For Measuring Frequency and High/Low Time Of A Digital Signal, both assigned to the assignee of the present invention, and fully incorporated by reference herein.

Figure 4:
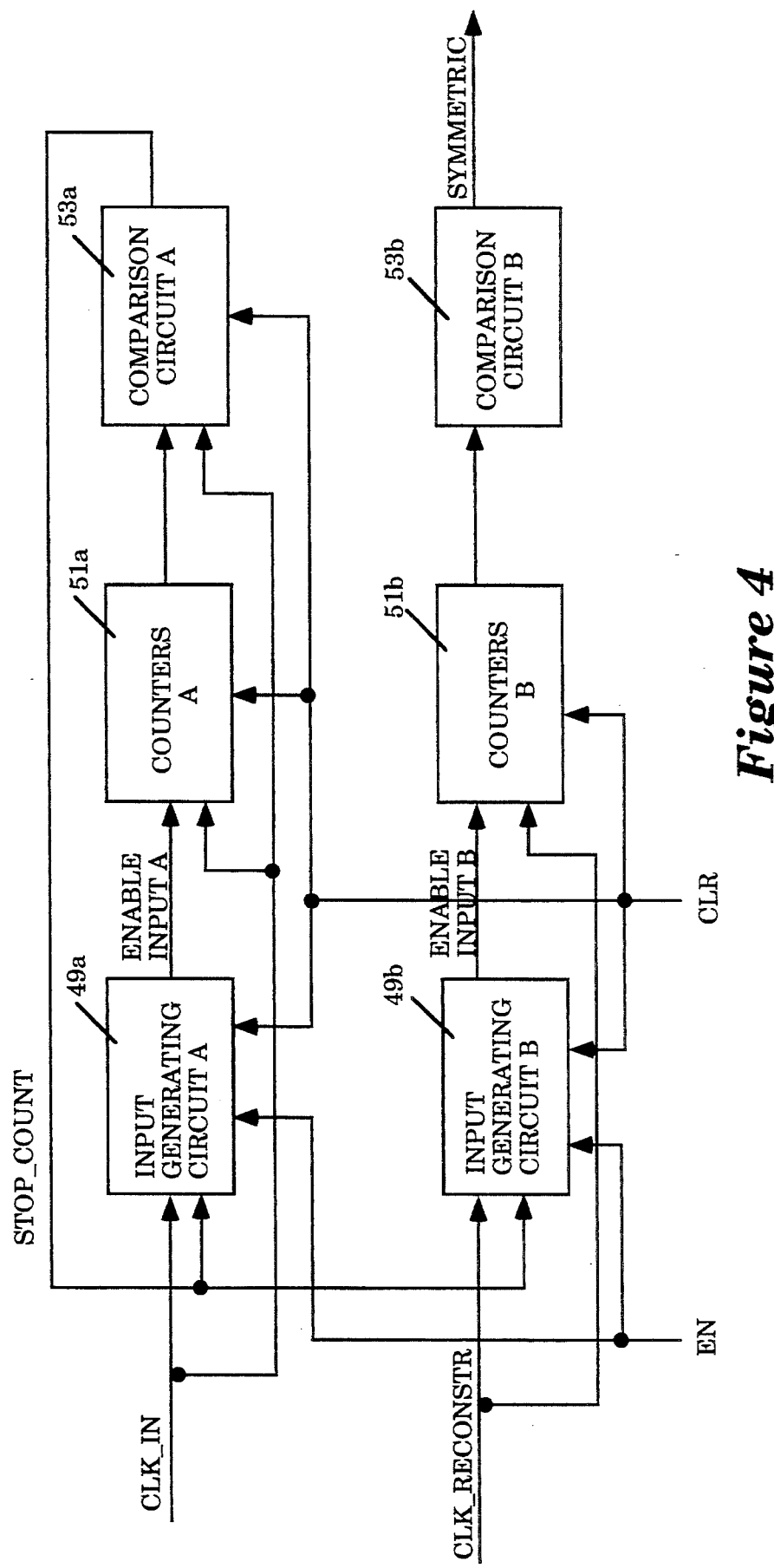
FIG. 4 illustrates one embodiment of the frequency symmetry testing circuit of the present invention.

Referring now to FIG. 4, a block diagram illustrating one embodiment of the frequency symmetry testing circuit of the present invention is shown. In this embodiment, the frequency symmetry testing circuit 44a comprises a first and a second input generating circuit 49a and 49b, a first and a second set of counters 51a and 51b, and a first and a second comparison circuit 53a and 53b. The first and second set of counters 51a and 51b are correspondingly coupled to the first and second input generating circuits 49a and 49b, and the first and second comparison circuits 53a and 53b. Additionally, the first comparison circuit 53a is also coupled to the first and second input generating circuits 49a and 49b.

The first and second input generating circuits 49a and 49b receive the entering digital clock and the reconstructed digital clock, and use them to generate enable inputs for the first and second sets of counters 51a and 51b. The first and second sets of counters 51a and 51b count the entering and reconstructed digital clocks while the enable inputs are provided. The first comparison circuit 53a monitors the first set of counters 51a, and stops both sets of input generating circuits 49a and 49b from providing further enable inputs to the first and second sets of counters 51a and 51b, after the first set of counter 51a reaches a predetermined level. The second comparison circuit 53b monitors the second set of counters 51b, and issues a control signal indicating the entering and reconstructed digital clocks are symmetric to each other, if the second set of counters 51b also stops substantially at the predetermined level, i.e. within an acceptable threshold.

While for ease of explanation, the present invention is being described with an embodiment having two series of input generating circuit, counter and comparison circuit for testing frequency symmetry of two digital signals, it will be appreciated that the present invention may be practiced with two or more series of input generating circuit, counter and comparison circuit for testing frequency symmetry of two or more digital signals. Additionally, while the primary function of the frequency symmetry testing circuit of the present invention is to compare digital signals and determine if they are symmetric to each other in frequency, the frequency symmetry testing circuit of the present invention can also be used to ensure the clock period of one or more of the digital signals being compared is 50% duty cycle symmetric, i.e. equal high and low time, when used with the calibration process described in the copending and incorporated by reference U.S. Patent Application, Ser. No. 08/040,124 identified above.

Figure 5A:
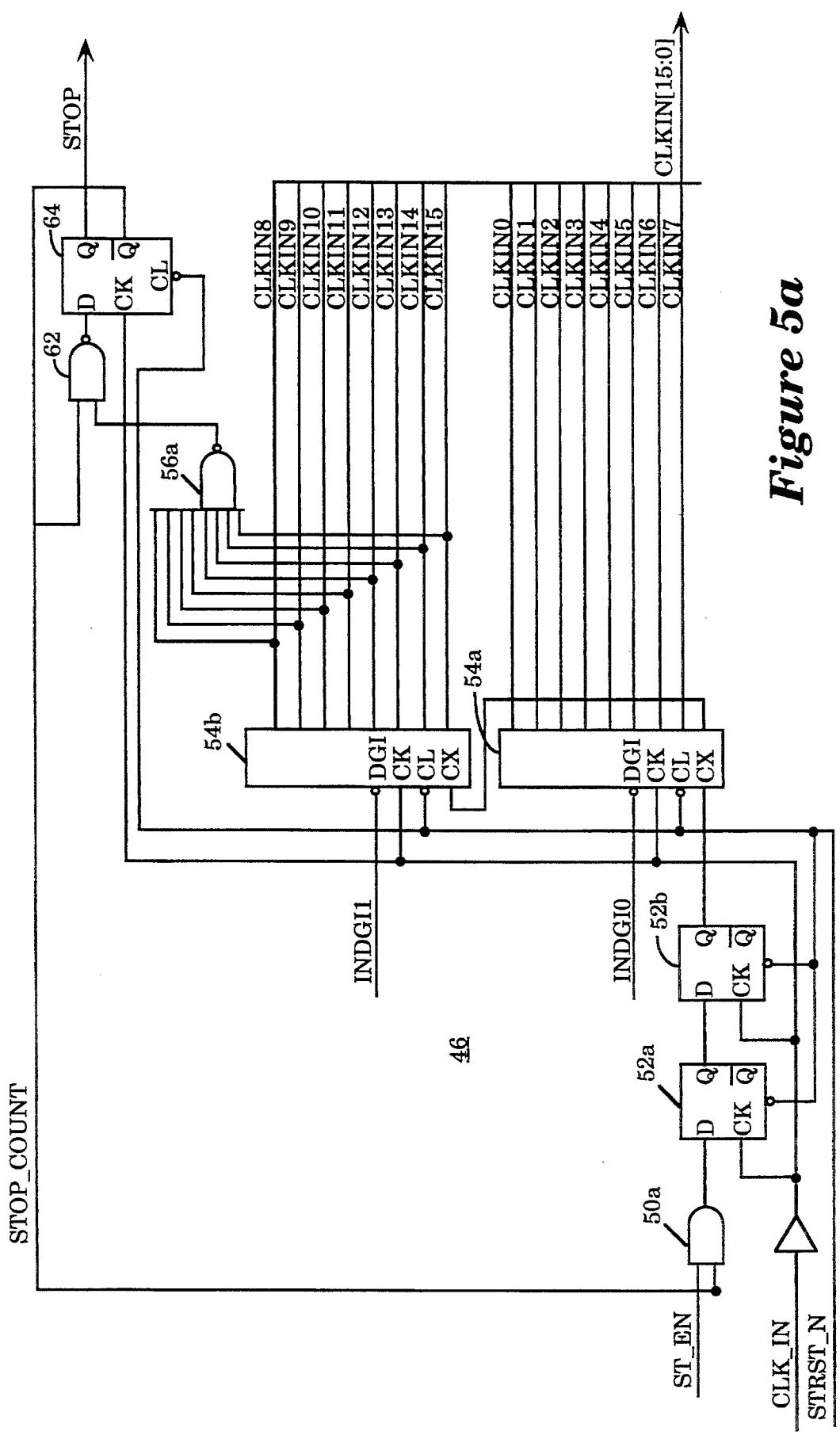
FIGS. 5a–5b illustrate the frequency symmetry testing circuit of FIG. 4 in further detail.
Figure 5B:
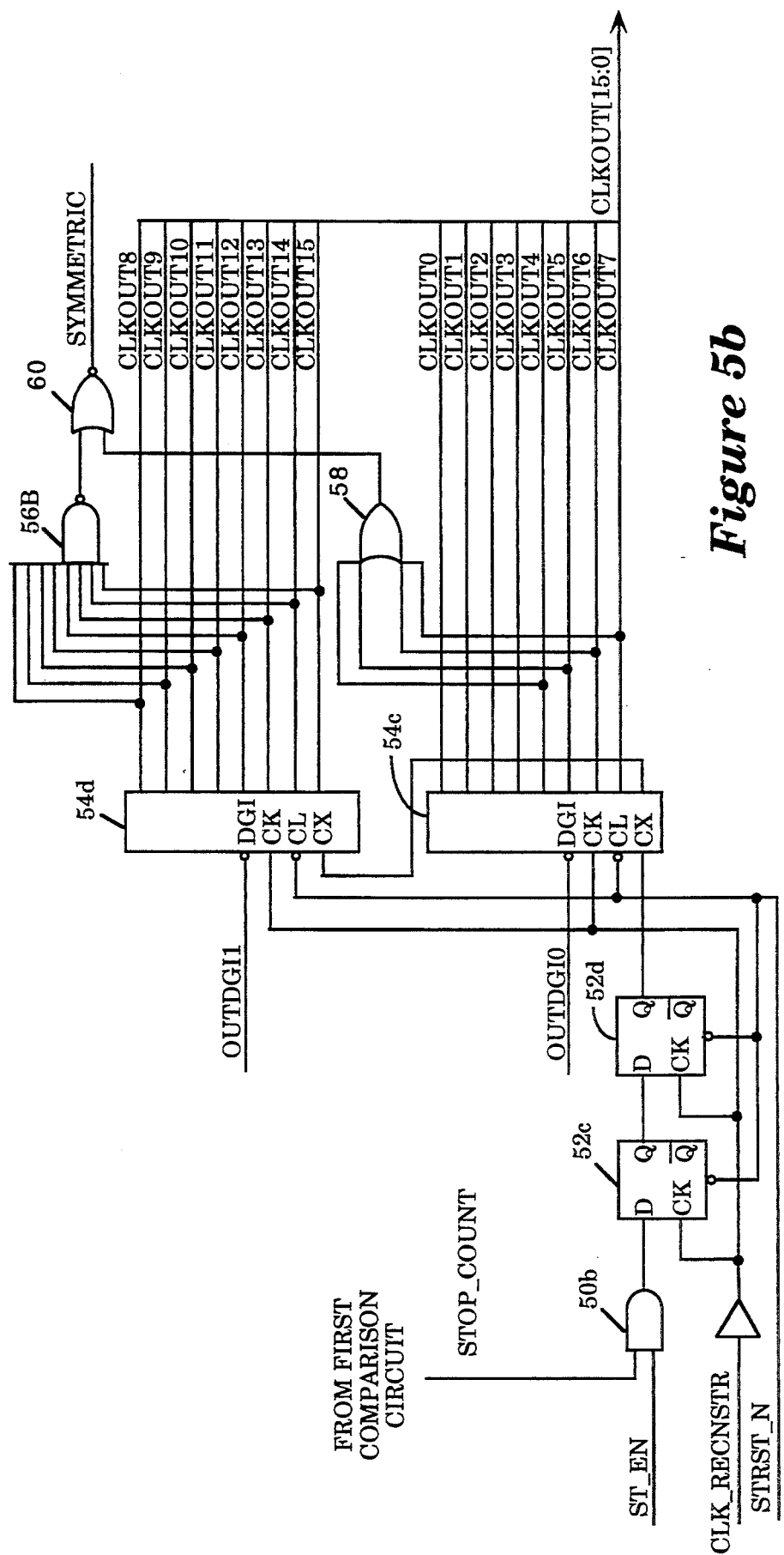

Referring now to FIGS. 5a–5b, two block diagrams illustrating the frequency symmetry testing circuit of FIG. 4 in further detail is shown. Each of the two input generating circuit comprises an AND gate 50a or 50b, a first and a second flip flop 52a–52b or 52c–52d, serially coupled to each other. The AND gate 50a or 50b is also coupled to the first comparison circuit, while the second flip flop 52b or 52d is also coupled to the first counter 54a or 54c of the corresponding set of counters. The AND gate 50a or 50b receives an enable signal from an external control source (not shown), and a stop count control signal from the first comparison circuit. Thus, the AND gate 50a or 50b outputs an enable input into the flip flops 52a–52b or 52c–52a, and in turn to the first counter 54a or 54c of the corresponding set of counters, whenever the enable signal and the stop count control signal both equal logic one. On the other hand, the AND gate 50a or 50b outputs a disable input into the flip flops 52a–52b or 52c–52d, and in turn to the first counter 54a or 54c of the corresponding set of counters, whenever the stop count control signal equals logic zero. The flip flops 52c–52d are also used to synchronize the stop count control signal to CLK_RECNSTR, while the flip flops 52a–52b provide a similar amount of delay to CLK_IN.

Each of the two sets of counters comprises two counters 54a–54b or 54c–54d. The counters 54a–54b or 54c–54d receive CLK_IN and CLK_RECNSTR, and the enable inputs from the corresponding input generating circuit, and in response, count CLK_IN and CLK_RECNSTR while the enable inputs are provided.

The first comparison circuit comprises a first and a second NAND gate 56a and 62, and a flip flop 64, serially coupled to each other. The first NAND gate 56a is also coupled to the second counter 54b of the first set of counters. The first NAND gate 56a receives the outputs of the second counter 54b of the first set of counters, and outputs into the second NAND gate 62. The second NAND gate 62, in addition to the output of the first NAND gate 56a, also receives a second input from the flip flop 64, and in turn outputs into the flip flop 64. The flip flop 64, in addition to outputting to the second NAND gate 62, also outputs to the AND gates 50a and 50b of the first and second input generating circuit. Thus, whenever the second counter 54b of the first set of counter reaches a predetermined level of all ones, the first NAND gate 56a outputs a logic zero, which in turn causes the second NAND gate 62 to output a logic one, thereby causing the flip flop 64 to output a logic zero for the stop count control signal, stopping the two input generating circuits from generating further enable inputs for the two sets of counters 54a–54b and 54c–54d. In this embodiment, as illustrated in FIGS. 5a–5b, the first set of counters 54a–54b stops counting when it reaches "FF03" (in hexadecimal).

The second comparison circuit comprises an OR gate 58, a NAND gate 56b, and a NOR gate 60 coupled to the OR gate 58 and the NAND gate 56b. The OR gate 58 and the NAND gate 56b are also coupled to the first and second counters 54c and 54d of the second set of counters respectively. The OR gate 58 receives the higher order bit outputs of the first counter 54c of the second set of counters as inputs. The NAND gate 56b receives the outputs of the second counter 54d of the second set of counter as inputs. The OR gate 58 and the NAND gate 56b in turn output into the NOR gate 60. Thus, the OR gate 58 outputs a logic zero whenever the first counter 54c of the first set of counters outputs logic zeroes for its higher order bits, and the NAND gate 56b outputs a logic zero whenever the second counter 54d of the first set of counters outputs all logic ones, thereby causing the NOR gate 60 to output a logic one indicating symmetry. In other words, the second comparison circuit outputs a logic one indicating the entering and reconstructed digital clocks are symmetric to each other if the second set of counters also stops substantially at the predetermined level, within an accepted threshold. In this embodiment, as illustrated in FIGS. 5a–5b, the acceptable threshold within the second set of counters 54c–54d must stop is between "FF00" and "FF0F" (in hexadecimal).

While the present invention has been described in terms of presently preferred and alternate embodiments, those skilled in the art will recognize that the invention is not limited to the embodiments described. The method and apparatus of the present invention can be practiced with modification and alteration within the spirit and scope of the appended claims. The description is thus to be regarded as illustrative instead of limiting on the present invention.

What is claimed is:

1. In a digital system comprising a first and a second digital signal, an apparatus for testing whether said first and second digital signals are symmetric to each other in frequency, said apparatus comprising:
   a) first and second input generating means for receiving said first and second digital signals, and generating a first and a second series of enable inputs using said first and second digital signals respectively;
   b) first and second counting means correspondingly coupled to said first and second input generating means for receiving said first and second digital signals and said first and second series of enable inputs, and counting said first and second digital signals while said first and second series of enable inputs are provided respectively;
   c) first comparison means coupled to said first and second input generating means and said first counting means for monitoring said counting in said first counting means, and stopping said first and second input generating means from generating said first and second series of enable inputs upon detecting said first counting means having reached a predetermined value;
   d) second comparison means coupled to said second counting means for monitoring said counting in said second counting means, and issuing a symmetric control signal indicating said first and second digital signals being symmetric to each other in frequency if said second counting means also stops substantially at the same predetermined value.

2. The apparatus as set forth in claim 1, wherein, each of said first and second input generating means comprises:
   a.1) an AND gate coupled to said first comparison means for receiving a stop counting control signal from said first comparison means, and an enable control signal, and outputting an output value; and a.2) a plurality of serially coupled flip flops coupled to said AND gate and a selected one of said first and second counting means for receiving said output value and a selected one of said first and second digital signals, and outputting a selected one of said first and second series of enable inputs.

3. The apparatus as set forth in claim 1, wherein, each of said first and second counting means comprises:

b.1) a plurality of serially coupled counters coupled to a selected one of said first and second input generating means, and a selected one of said first and second comparison means for receiving a selected one of said first and second series of enable inputs and a selected one of said first and second digital signals, counting said received selected one of said first and second digital signals while said selected one of first and second series of enable inputs is provided, and outputting a selected one of a first and a second count value.

4. The apparatus as set forth in claim 1, wherein, said first comparison means comprises:

c.1) a first NAND gate coupled to said first counting means for receiving a plurality of higher order bits of a count value from said first counting means, and outputting a first comparison value;

c.2) a second NAND gate coupled to said first NAND gate for receiving said first comparison value, and a stop count control signal, and outputting a second comparison value; and c.3) a flip flop coupled to said second NAND gate for receiving said second comparison value and said first digital signal, and generating said stop count control signal.

5. The apparatus as set forth in claim 1, wherein, said second comparison circuit comprises:

d.1) a NAND gate coupled to said second counting means for receiving a plurality of higher order bits of a count value from said second counting means, and outputting a first comparison value;

d.2) an OR gate coupled to said second counting means for receiving a plurality of intermediate order bits of said count value from said second counting means, and outputting a second comparison value; and d.3) a NOR gate coupled to said NAND gate and said OR gate for receiving said first and second comparison values, and outputting said symmetric control signal.

6. In a digital system comprising a first and a second digital signal, a method for testing whether said first and second digital signals are symmetric to each other in frequency, said method comprising the steps of:

a) generating a first and a second series of enable inputs using said first and second digital signals respectively by a.1) receiving a stop counting control signal and an enable control signal, and performing an AND operation against said stop counting control signal and said enable control signal to generate an output value, and a.2) receiving said output value and said first and second digital signals., and outputting said first and second series of enable inputs using said output value and said first and second digital signals;

b) receiving said first and second series of enable inputs and said first and second digital signals, and counting said first and second digital signals while said first and second series of enable inputs are provided; and c) stopping said generation of said first and second series of enable inputs upon detecting said counting of said first digital signal having reached a predetermined value; and d) issuing a symmetric control signal indicating said first and second digital signals being symmetric to each other in frequency if said counting of said second digital signal also stops substantially at the same predetermined value.

7. The method as set forth in claim 6, wherein, said counting performed for each of said first and second digital signals in said step b) comprises:

b.1) receiving a selected one of said first and second series of constant enable inputs and a selected one of said first and second digital signals, counting said received selected one of said first and second digital signals while said selected one of said first and second series of enable inputs is provided, and outputting a selected one of a first and a second count value.

8. The method as set forth in claim 6, wherein, said step c) comprises:

c.1) receiving a plurality of higher order bits of a count value for said counting of said first digital signal, performing an first NAND operation against said higher order bits of said count value, and outputting a first comparison value;

c.2) receiving said first comparison value and a stop count control signal, performing a second NAND operation against said first comparison value and said stop count control signal, and outputting a second comparison value; and c.3) receiving said second comparison value and said first digital signal, and generating said stop count control signal.

9. The method as set forth in claim 6, wherein, said step d) comprises:

d.1) receiving a plurality of higher order bits of a count value for counting said second digital signal, performing a NAND operation against said higher order bits of said count value, and outputting a first comparison value;

d.2) receiving a plurality of intermediate order bits of said count value, performing an OR operation against said intermediate order bits of said count value, and outputting a second comparison value; and d.3) receiving said first and second comparison values, performing a NOR operation against said first and second comparison values, and outputting said symmetric control signal.

10. In a digital system comprising a first and a second digital signal, a circuit for testing whether said first and second digital signals are symmetric to each other, said circuit comprising:

a) first and second input generating circuits for receiving said first and second digital signals, and generating a first and a second series of enable inputs using said first and second digital signals respectively;

b) first and second sets of counters correspondingly coupled to said first and second input generating circuits for receiving said first and second digital signals and said first and second series of enable inputs, and counting said first and second digital signals while said first and second series of enable inputs are provided respectively;

c) first comparison circuit coupled to said first and second input generating circuits and said first set of counters for monitoring said counting in said first set of counters, and stopping said first and second input generating circuits from generating said first and second series of enable inputs upon detecting said first sets of counters having reached a predetermined value;

d) second comparison circuit coupled to said second set of counters for monitoring said counting in said second counting circuit, and issuing a symmetric control signal indicating said first and second digital signals being symmetric to each other in frequency if said second set of counters also stops substantially at the same predetermined value.

11. The circuit as set forth in claim 10, wherein, each of said first and second input generating circuits comprises:

a.1) an AND gate coupled to said first comparison circuit for receiving a stop counting control signal from said first comparison circuit, and an enable control signal, and outputting an output value; and a.2) a plurality of serially coupled flip flops coupled to said AND gate and a selected one of said first and second sets of counters for receiving said output value and a selected one of said first and second digital signals, and outputting a selected one of said first and second series of enable inputs.

12. The circuit as set forth in claim 10, wherein, each of said first and second counting circuits comprises:

b.1) a plurality of serially coupled counters coupled to a selected one of said first and second input generating circuits, and a selected one of said first and second comparison circuits for receiving a selected one of said first and second series of enable inputs and a selected one of said first and second digital signals, counting said received selected one of said first and second digital signals while said selected one of said first and second series of enable inputs, and outputting a selected one of a first and a second count value.

13. The circuit as set forth in claim 10, wherein, said first comparison circuit comprises:

c.1) a first NAND gate coupled to said first set of counters for receiving a plurality of higher order bits of a count value from said first set of counters, and outputting a first comparison value;

c.2) a second NAND gate coupled to said first NAND gate for receiving said first comparison value, and a stop count control signal, and outputting a second comparison value; and c.3) a flip flop coupled to said second NAND gate for receiving said second comparison value and said first digital signal, and generating said stop count control signal.

14. The circuit as set forth in claim 10, wherein, said second comparison circuit comprises:

d.1) a NAND gate coupled to said second counting circuit for receiving a plurality of higher order bits of a count value from said second counting circuit, and outputting a first comparison value;

d.2) an OR gate coupled to said second counting circuit for receiving a plurality of intermediate order bits of said count value from said second counting circuit, and outputting a second comparison value; and d.3) a NOR gate coupled to said NAND gate and said first OR gate for receiving said first and second comparison values, and outputting said symmetric control signal.

15. The circuit as set forth in claim 10, wherein, said digital system is a data instrumentation system;

said first digital signal is a skewed digital clock entering a high speed circuit of said data instrumentation system; and said second digital signal is a reconstructed digital clock output by a digital clock reconstruction circuit of said high speed circuit.

16. An improved data instrumentation system, the improvement comprising:

a) an improved high speed digital circuit having a digital clock reconstruction circuit for outputting a first reconstructed digital clock based on an entering digital clock, and a frequency symmetry testing circuit for testing periodically whether said reconstructed digital clock and said entering digital clock are symmetric in frequency, said frequency symmetry testing circuit having a.1) first and second input generating circuits for receiving said entering and first reconstructed digital clocks, and generating a first and a second series of enable inputs using said entering and first reconstructed digital clocks respectively;

a.2) first and second sets of counters correspondingly coupled to said first and second input generating circuits for receiving said entering and first reconstructed digital clocks and said first and second series of enable inputs, and counting said entering and first reconstructed digital clocks while said first and second series of enable inputs are provided respectively;

a.3) first comparison circuit coupled to said first and second input generating circuits and said first set of counters for monitoring said counting in said first set of counters, and stopping said first and second input generating circuits from generating said first and second series of enable inputs upon detecting said first sets of counters having reached a predetermined value;

a.4) second comparison circuit coupled to said second set of counters for monitoring said counting in said second counting circuit, and issuing a symmetric control signal indicating said entering and reconstructed digital clocks being symmetric to each other in frequency if said second set of counters also stops substantially at the same predetermined value.

17. The improved data instrumentation system as set forth in claim 16, wherein, said digital clock reconstruction circuit further outputs a second reconstructed clock, said frequency symmetry testing circuit further being used to test periodically whether said second reconstructed digital clock and said entering digital clock are symmetric in frequency, said frequency symmetry testing result of said second reconstructed digital clock and said entering digital clock being used to provide early warning against said first reconstructed clock drifting away from having a 50% duty cycle symmetric reconstructed clock period.

* * * * *